United States Patent
Jung

(10) Patent No.: US 8,899,811 B2
(45) Date of Patent: Dec. 2, 2014

(54) LIGHT EMITTING DEVICE MODULE AND BACKLIGHT UNIT INCLUDING THE SAME

(75) Inventor: Su Jung Jung, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 109 days.

(21) Appl. No.: 13/308,837

(22) Filed: Dec. 1, 2011

(65) Prior Publication Data
US 2012/0140520 A1  Jun. 7, 2012

(30) Foreign Application Priority Data
Dec. 7, 2010  (KR) .................. 10-2010-0123949

(51) Int. Cl.
F21V 7/00  (2006.01)
F21V 8/00  (2006.01)

(52) U.S. Cl.
CPC ............ *G02B 6/0031* (2013.01); *G02B 6/0068* (2013.01); *G02B 6/003* (2013.01); *G02B 6/0083* (2013.01); *G02B 6/0091* (2013.01); *G02B 6/0073* (2013.01)
USPC ....... 362/612; 362/249.02; 362/609; 362/247

(58) Field of Classification Search
CPC ............ F21Y 103/003; F21Y 2101/02; G02B 6/0068; H01L 33/20; H01L 33/60; H01L 25/0753; F21S 4/001; F21K 9/00
USPC ............ 362/249.02, 612, 238, 240, 241, 247, 362/609, 84; 257/98
See application file for complete search history.

(56) References Cited

U.S. PATENT DOCUMENTS

| | | | | |
|---|---|---|---|---|
| 4,935,665 A * | 6/1990 | Murata | ......................... | 313/500 |
| 5,119,174 A * | 6/1992 | Chen | ............................... | 257/98 |
| 5,534,718 A * | 7/1996 | Chang | ............................. | 257/98 |
| 6,072,171 A * | 6/2000 | Nakamura et al. | ............ | 250/216 |
| 7,018,065 B2 * | 3/2006 | Tamai | .......................... | 362/247 |
| 7,175,329 B1 * | 2/2007 | Chou | ........................... | 362/612 |
| 7,427,145 B2 * | 9/2008 | Jang et al. | ..................... | 362/236 |
| 7,638,808 B2 * | 12/2009 | Owen et al. | ..................... | 257/88 |
| 7,699,500 B2 * | 4/2010 | Takemoto et al. | ............ | 362/294 |
| 8,067,777 B2 * | 11/2011 | Fjelstad | ........................ | 257/88 |
| 8,157,412 B2 * | 4/2012 | Lin et al. | ........................ | 362/241 |
| 2003/0168720 A1 | 9/2003 | Kamada | ........................ | 257/666 |
| 2006/0001055 A1* | 1/2006 | Ueno et al. | ..................... | 257/257 |
| 2006/0012298 A1* | 1/2006 | Lee et al. | ....................... | 313/512 |

(Continued)

FOREIGN PATENT DOCUMENTS

| | | | |
|---|---|---|---|
| JP | 2010-243973 A | | 10/2010 |
| KR | 10-2002-0035819 A | | 5/2002 |
| KR | 10-2010-0086692 A | | 8/2010 |
| KR | 10-2010-0119603 A | | 11/2010 |

OTHER PUBLICATIONS

Kingbright; AP2012SURCK; SMD Chip LED Lamp Data Sheet (2005).

(Continued)

*Primary Examiner* — Peggy Neils
(74) *Attorney, Agent, or Firm* — KED & Associates LLP

(57) ABSTRACT

Disclosed is a light emitting device module, which includes a circuit board having at least two cavities, a reflective layer formed on a surface of each cavity, and a light emitting device package disposed in each cavity. The light emitting device package includes a package body and a light emitting device disposed on the package body, the light emitting device being electrically connected to a first lead frame and a second lead frame.

20 Claims, 6 Drawing Sheets

(56) References Cited

U.S. PATENT DOCUMENTS

| | | | |
|---|---|---|---|
| 2006/0012992 A1 | 1/2006 | Lee | 362/237 |
| 2006/0072315 A1 | 4/2006 | Han et al. | 362/231 |
| 2007/0008739 A1* | 1/2007 | Kim et al. | 362/612 |
| 2007/0145398 A1 | 6/2007 | Shin | 257/98 |
| 2007/0263408 A1* | 11/2007 | Chua | 362/612 |
| 2009/0135581 A1* | 5/2009 | Yano et al. | 362/84 |
| 2010/0290247 A1 | 11/2010 | Im | 362/606 |
| 2011/0210360 A1* | 9/2011 | Negley et al. | 257/98 |

OTHER PUBLICATIONS

QT Optoelectronics; LED55B/C, LED56 GaAs Infrared Emitting Diode Data Sheet.

European Search Report dated Apr. 19, 2012 issued in Application No. 11 19 2455.

* cited by examiner

LIGHT EMITTING DEVICE MODULE AND BACKLIGHT UNIT INCLUDING THE SAME

This application claims the benefit of Korean Patent Application No. 10-2010-0123949, filed on, Dec. 7, 2010, which is hereby incorporated by reference as if fully set forth herein.

BACKGROUND OF THE INVENTION

1. Field of the Invention

Embodiments relate to a light emitting device module and a backlight unit including the same.

2. Discussion of the Related Art

Light emitting devices, such as Light Emitting Diodes (LEDs) or Laser Diodes (LDs), which use group III-V or group II-VI compound semiconductors, are capable of emitting light of various colors, such as red, green, blue, and ultraviolet light and the like, owing to developments of device materials and thin film growth technologies. Moreover, these light emitting devices are capable of emitting white light with high efficiency through use of a fluorescent substance or color combination, and have advantages of low power consumption, semi-permanent lifespan, fast response time, safety and environmental friendliness as compared to conventional light sources, such as fluorescent lamps, incandescent lamps and the like.

Accordingly, application sectors of light emitting devices are expanded up to transmitting modules of optical communication means, LED backlights to replace Cold Cathode Fluorescence Lamps (CCFLs) which serve as backlights of Liquid Crystal Display (LCD) apparatuses, white LED lighting apparatuses to replace fluorescent lamps or incandescent lamps, head lights of vehicles and traffic lights.

In the lighting apparatuses and display apparatuses, a light emitting device package in which light emitting devices are mounted on and electrically connected to a package body are widely used.

SUMMARY OF THE INVENTION

An object of embodiments is to provide efficient arrangement of a light emitting device module.

To achieve these objects and other advantages and in accordance with the purpose of the embodiments, as embodied and broadly described herein, a light emitting device module includes a circuit board having at least two cavities, a reflective layer formed on a surface of each cavity, and a light emitting device package disposed in each cavity and including a package body and a light emitting device disposed on the package body, the light emitting device being electrically connected to a first lead frame and a second lead frame.

At least a portion of the package body of the light emitting device package may be inserted into the cavity.

The package body may be flat and at least a portion of the light emitting device may be inserted into the cavity.

The package body may be have a recess and the light emitting device may be disposed in the recess.

The light emitting device module may further include a light diffuser disposed on the top of the package body, and a height from a bottom surface of the cavity to a highest point of the light diffuser may be in a range from 1.6 mm to 2.0 mm.

A depth of the cavity may be in a range from 0.3 mm to 0.7 mm.

The cavity may include a bottom surface and an inclined surface, and the light emitting device package may be disposed on the bottom surface.

Both inclined surfaces of the neighboring cavities may define a partition that divides both light emitting device packages disposed respectively in the neighboring cavities from each other.

The cavity may be defined by a bottom surface and a sidewall perpendicular to the bottom surface.

The reflective layer may be formed on a bottom surface of the cavity.

The reflective layer may be formed on a partition between the neighboring cavities.

The reflective layer may be formed on a sidewall of a partition between the neighboring cavities.

A height of the package body may be in a range from 0.3 mm to 0.7 mm, and a height of the light diffuser may be in a range from 1.3 mm to 1.5 mm.

The light emitting device module may further include a molding part to cover the light emitting device.

The molding part may contain a fluorescent substance.

In accordance with another aspect, a light emitting device module includes a circuit board including a first layer and a second layer having at least two cavities, a reflective layer formed on a surface of each cavity, at least one light emitting device package disposed in each cavity, and a light diffuser disposed on the top of the package body, wherein the light emitting device package includes a package body and a light emitting device disposed on the package body, the light emitting device being electrically connected to a first lead frame and a second lead frame.

The reflective layer may be formed on a bottom surface of the cavity so as to come into contact with a lower portion of the package body.

The reflective layer may be formed on a partition between both package bodies disposed in the neighboring cavities.

In accordance with a further aspect, a backlight unit includes a light emitting device module, a light guide plate to diffuse light introduced from the light emitting device module, and a bottom cover to accommodate the light emitting device module and the light guide plate, wherein the light emitting device module includes a circuit board having at least two cavities, a reflective layer formed on a surface of each cavity, and a light emitting device package disposed in each cavity and including a package body and a light emitting device disposed on the package body, the light emitting device being electrically connected to a first lead frame and a second lead frame.

The light emitting device module may further include a light diffuser in the form of a lens to change a path of light emitted from the light emitting device, and the light guide plate may be provided at a surface thereof facing the light emitting device module with a groove corresponding to the light diffuser of the light emitting device module.

BRIEF DESCRIPTION OF THE DRAWINGS

Arrangements and embodiments may be described in detail with reference to the following drawings in which like reference numerals refer to like elements and wherein.

DETAILED DESCRIPTION OF THE INVENTION

Figure 1:
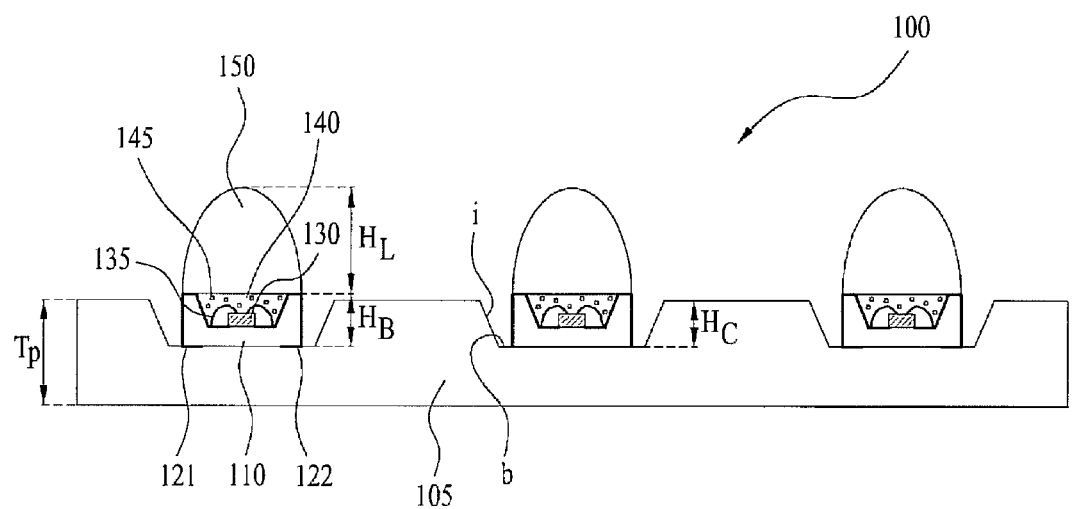
FIGS. 1 to 5 are sectional views illustrating embodiments of a light emitting device module.

Reference will now be made in detail to the preferred embodiments, examples of which are illustrated in the accompanying drawings.

Prior to description of the embodiments, it will be understood that, when each element, such as a layer (film), region, pattern or structure is referred to as being formed "on" or "under" the other element, such as a substrate, layer (film), region, pad or pattern, it can be directly "on" or "under" the other element or be indirectly formed with intervening one or more other elements therebetween. Also, the terms "on" or "under" may indicate either a downward direction or an upward direction when reinforcing a single element.

In the drawings, the thickness or size of each layer may be exaggerated, omitted or schematically illustrated for clarity and convenience. In addition, the size of each constituent element does not wholly reflect an actual size thereof.

FIGS. 1 to 5 are sectional views illustrating embodiments of a light emitting device module. Hereinafter, the embodiments of the light emitting device module will be described with reference to FIGS. 1 to 5.

Referring to FIG. 1 illustrating a first embodiment of the light emitting device module 100, a plurality of cavities is formed in a circuit board 105 and a single light emitting device package is disposed in each cavity. As the circuit board 105, a printed circuit board or the like may be used.

The light emitting device package includes a package body 110, a first lead frame 121 and a second lead frame 122 installed to the package body 110, a light emitting device 130 embedded in the package body 110 so as to be electrically connected to the first lead frame 121 and the second lead frame 122, and a molding part 140 configured to surround the light emitting device 130.

The package body 110 may be formed of a silicon material, a synthetic resin material, or a metal material. An inclined surface may be provided around the light emitting device 130, which may boost luminous efficiency. Although the present embodiment describes the package body 110 as having a recess and the light emitting device 130 as being disposed in the recess, the package body 110 may be flat, in the case in which a light emitting device disposed on the flat package body 110 may be at least partially inserted into a cavity formed in a circuit board.

The first lead frame 121 and the second lead frame 122 are electrically separated from each other and are adapted to supply power to the light emitting device 130. Moreover, the first lead frame 121 and the second lead frame 122 may reflect light emitted from the light emitting device 130 so as to increase luminous efficiency and also, may serve to radiate heat generated in the light emitting device 130 to the outside.

The light emitting device 130 may be installed on the package body 110, or may be installed on the first lead frame 121 or the second lead frame 122. In these embodiments or other embodiments, the light emitting device 130 may be semiconductor light emitting device, for example light emitting diode.

The light emitting device 130 may be bonded to the first lead frame 121 and the second lead frame 122 by means of wires 135 so as to be electrically connected to the first and second lead frames 121 and 122. In this case, instead of the bonding method using wires 135 as illustrated, conduction between the light emitting device 130 and lead frames by a flip chip method, a die bonding method or the like may be possible.

The molding part 140 may surround the light emitting device 130 to protect the same. The molding part 140 contains a fluorescent substance 145, which may change the wavelength of light emitted from the light emitting device 130.

A light diffuser 150 is provided on the molding part 140. As the light diffuser 150, a lens or the like may be used. A first wavelength range of light emitted from the light emitting device 130 is excited by the fluorescent substance 145, thereby being converted into a second wavelength range of light. As the second wavelength range of light passes through the lens, an optical path thereof may be changed. The light diffuser 150 may be fixed to the top of the package body 110.

The circuit board 105 is provided with a patterned circuit formed of a conductive material. The first lead frame 121 and the second lead frame 122 as described above are connected to the conductive material so as to supply electric current to the light emitting device 130.

The circuit board 105 may have a thickness $T_P$ of about 1 mm, and the cavity formed in the circuit board 105 may have a depth $H_C$ in a range from 0.3 mm to 0.7 mm. Although the deeper the cavity, the smaller the height of the light emitting device package, it is difficult to form the cavity to a depth greater than 0.7 mm in consideration of a space required to pattern the conductive material in the circuit board 105.

The package body 110 has a height $H_B$ in a range from about 0.3 mm to about 0.7 mm and the light diffuser 150 (i.e. the lens) has a height in a range from about 1.3 mm to about 1.5 mm. As such, a height from a bottom surface of the cavity, on which the light emitting device package is placed, to a highest point of the light diffuser 150 is in a range from 1.6 mm to 2.0 mm. Here, due to the presence of the cavity formed in the circuit board 105, a total thickness of the circuit board 105 and the entire light emitting device package is in a range from 2.1 mm to 2.7 mm. That is, a height of the light emitting device module is reduced in direct proportion to the depth of the cavity in the circuit board 105.

In FIG. 1, the cavity is defined by the bottom surface b and the inclined surface i, and the light emitting device package is disposed on the bottom surface b. The inclined surface i may construct a partition that divides neighboring light emitting device packages from each other. In an alternative embodiment, a sidewall s perpendicular to the bottom surface b may divide neighboring light emitting device packages from each other. Additionally, a reflective layer 160 that will be described hereinafter may be formed on the surface of the cavity, i.e. on the bottom surface b, the inclined surface i or the sidewall s.

Figure 2:
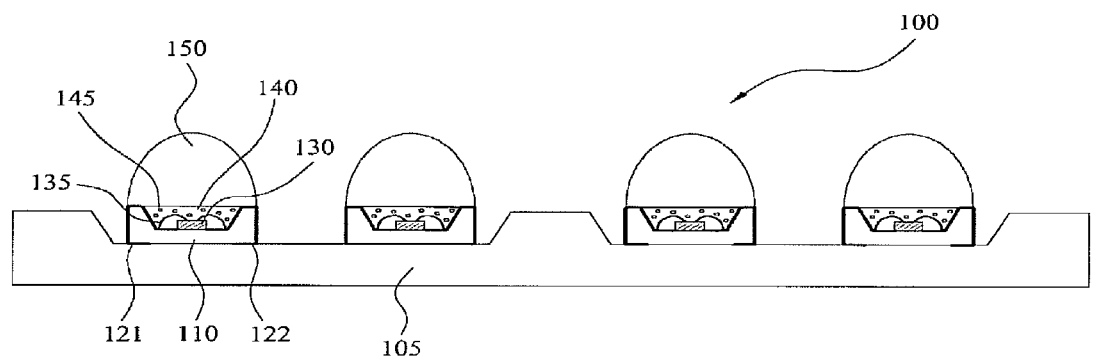

Referring to FIG. 2, a second embodiment with regard to the light emitting device module 100 is identical to the embodiment illustrated in FIG. 1, except that two light emitting device packages are disposed in a single cavity. Alternatively, three or more light emitting device packages may be disposed in a single cavity, and different numbers of light emitting device packages may be disposed in respective cavities.

With this configurations of the cavity and the light emitting device package, for example, light emitting device packages that emit the same color of light may be grouped, or light emitting device packages that emit red, green and blue light respectively may be disposed in a single cavity.

Figure 3:
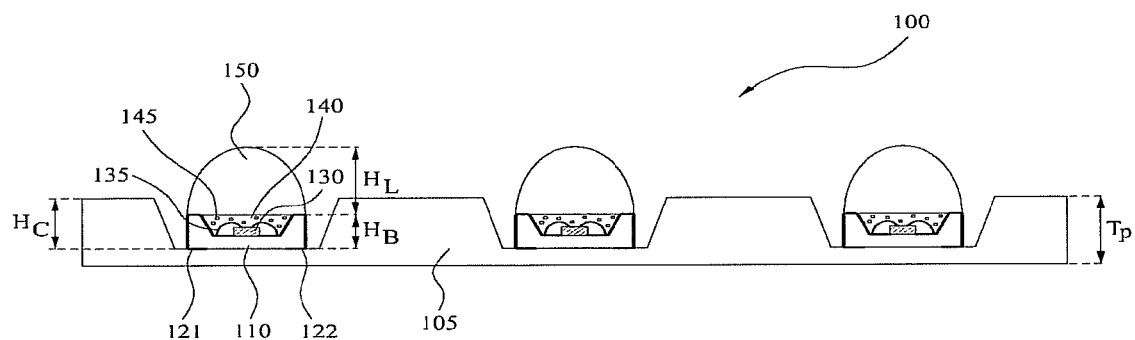

The light emitting device module 100 illustrated in FIG. 3 is identical to that in the embodiment illustrated in FIG. 1, except that the cavity formed in the circuit board 105 has a greater depth. Specifically, the package body 110 of the light emitting device package illustrated in FIG. 1 is not wholly inserted into the cavity, whereas the package body 110 of the light emitting device package according to the present embodiment is wholly inserted into the cavity.

Figure 4:
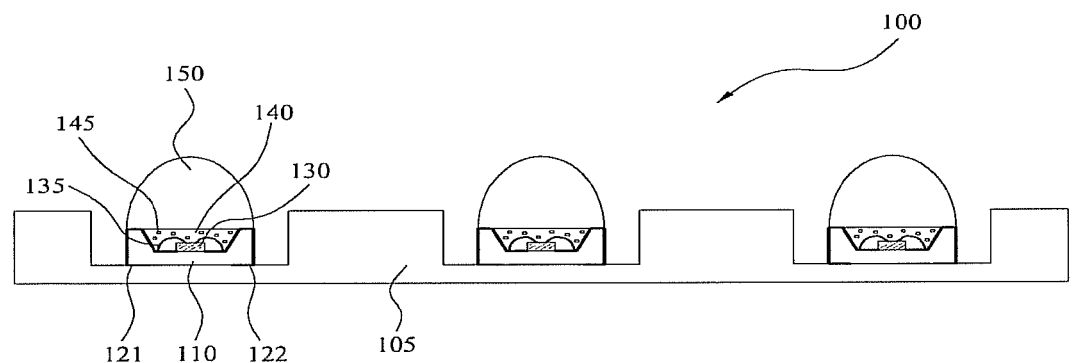

In an embodiment illustrated in FIG. 4, unlike the embodiment illustrated in FIG. 1, the cavity formed in the circuit board 105 has a vertical lateral surface. Specifically, in the embodiment illustrated in FIG. 1, the bottom surface of the cavity is flat and the edge of the cavity is inclined. On the other hand, in the present embodiment, although the bottom surface of the cavity is flat in the same manner, the edge of the cavity is perpendicular to the bottom surface. Similarly, all the light emitting device packages are disposed on the bottom surface of the cavity. An inner surface of the cavity may be at least partially perpendicular to the bottom surface of the cavity.

Figure 5:
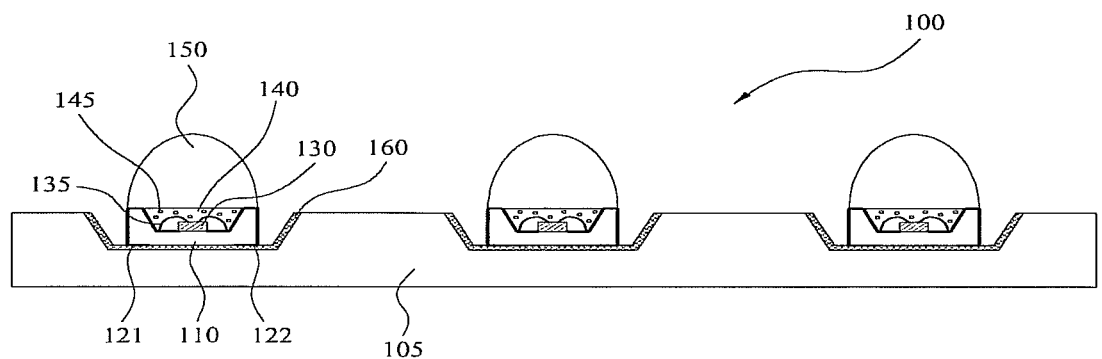

In an embodiment illustrated in FIG. 5, the reflective layer 160 is formed on the surface of the cavity in the circuit board 105. Specifically, to reflect light directed from the light emitting device package toward the circuit board 105, the reflective layer 160 formed of a high reflectivity material, such as silver (Ag), aluminum (Al) or the like, is applied to the cavity.

The reflective layer 160 may be formed on the bottom surface of the cavity so as to come into contact with a lower portion of the package body 110, or may be formed at a partition for the package body 110. Here, the partition for the package body 110 refers to an inclined edge portion of the cavity.

FIGS. 6A to 6D are views illustrating a method of manufacturing a light emitting device module according to an embodiment.

First, as illustrated in FIG. 6, the circuit board 105 is prepared. The circuit board 105 may be a printed circuit board, on which a first layer of a conductive material, such as copper (Cu) or the like, is patterned to obtain a circuit and then, a high thermal conductivity material, such as aluminum (Al) or the like, is stacked on the first layer with an insulating layer interposed therebetween.

Figure 6A:
FIGS. 6A to 6D are views illustrating a method of manufacturing a light emitting device module according to an embodiment.
Figure 6B:
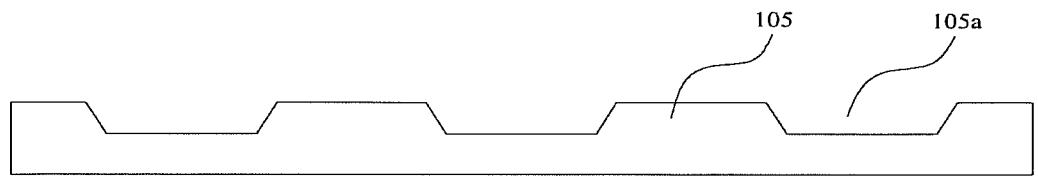

Referring to FIG. 6B, a surface of the circuit board 105 is etched, patterning a plurality of cavities 105a. The cavity 105a is a region where a light emitting device will be disposed as well as where reflection of light emitted from the light emitting device will occur. Although the cavity may be patterned into various shapes, it is noted that a bottom surface of the cavity, on which the light emitting device will be placed, must be flat and that a lateral surface of the cavity may be inclined to increase luminous efficiency.

Figure 6C:
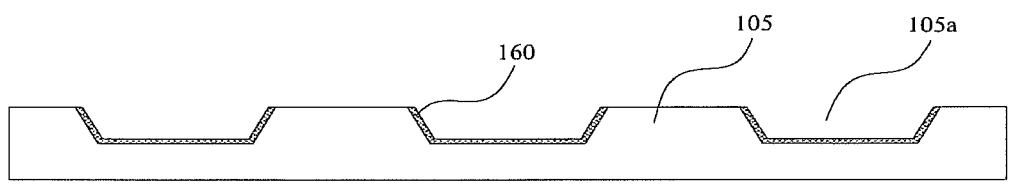
Figure 6D:
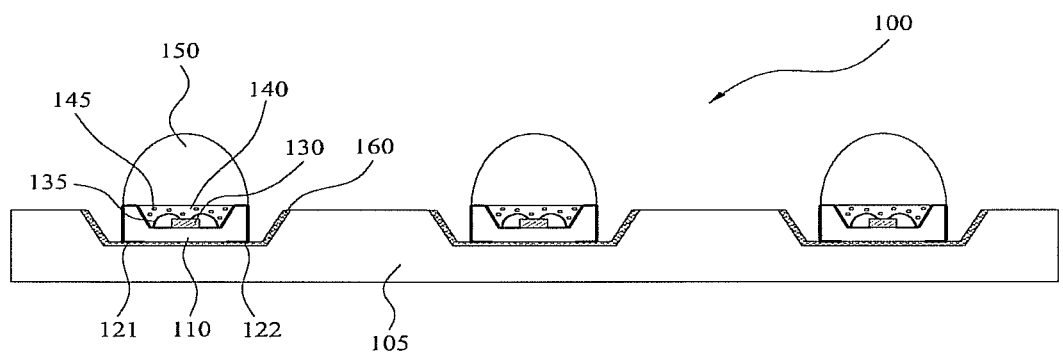

Referring to FIG. 6C, the reflective layer 160 is formed on each cavity 105a. Then, the light emitting device package is disposed in the cavity 105a as illustrated in FIG. 6D.

The light emitting device module according to the above described embodiments has a reduced height from the circuit board to the lens of the light emitting device package, which may reduce a volume of a lighting apparatus, a display apparatus or the like employing the light emitting device module.

Figure 7:
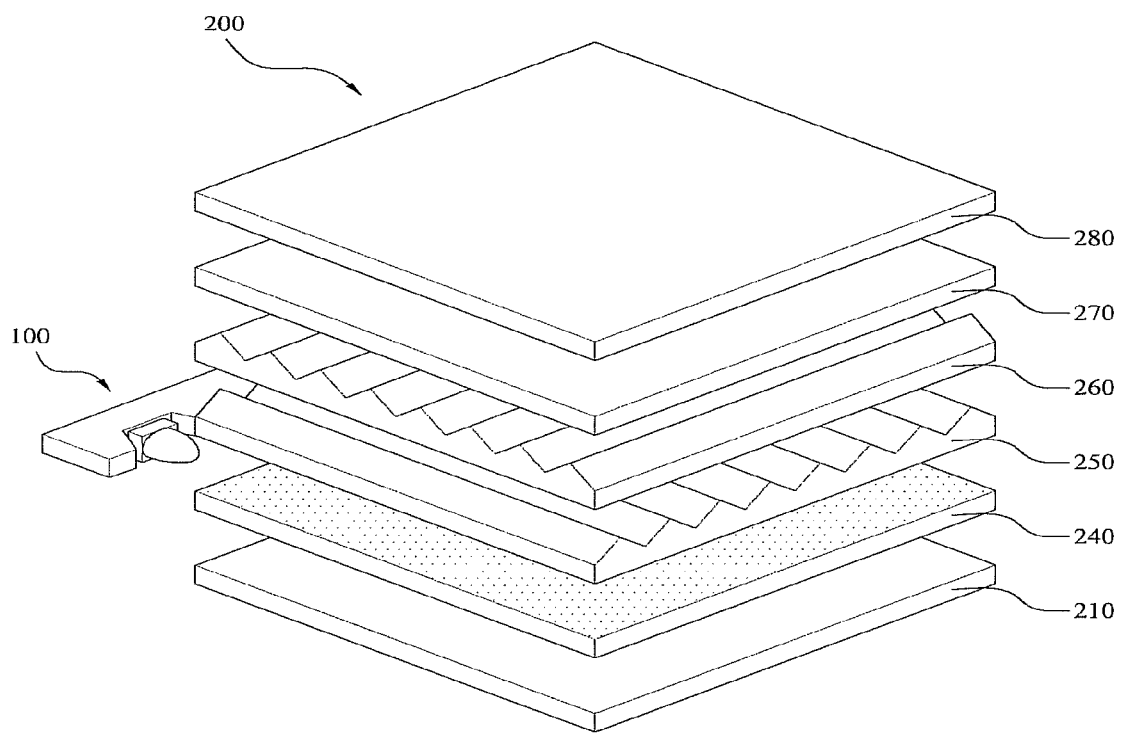
FIG. 7 is a view illustrating a display apparatus including a light emitting device module.

FIG. 7 is a view illustrating a display apparatus including the light emitting device module.

As illustrated, the display apparatus 200 according to the present embodiment includes the light emitting device module 100, a bottom cover 210 provided with a reflector, a light guide plate 240 disposed in front of the bottom cover 210 to guide light emitted from the light emitting device module 100 forward of the display apparatus 200, a first prism sheet 250 and a second prism sheet 260 disposed in front of the light guide plate 240, a panel 270 disposed in front of the second prism sheet 260, and a color filter 280 disposed in front of the panel 270.

The light emitting device module, as illustrated in FIGS. 1 to 5, is constructed in such a way that a plurality of light emitting device packages is seated on a circuit board having cavities.

The bottom cover 210 may accommodate constituent elements of the display apparatus 200. The reflector may be prepared by coating a rear surface of the light guide plate 240 or a front surface of the bottom cover 210 with a high reflectivity material, or by a separate material on the bottom cover 210.

Here, the reflector may be formed of a material that has high reflectivity and is usable in a super thin form. For example, the reflector may be formed of polyethylene terephtalate (PET).

The light guide plate 240 functions to scatter light emitted from the light emitting device module, allowing the light to be uniformly distributed throughout the screen of the liquid crystal display apparatus. Thus, the light guide plate 240 may be formed of a material having high refractivity and transmittance. For example, the light guide plate 240 may be formed of polymethylmethacrylate (PMMA), polycarbonate (PC), polyethylene (PE) or the like.

In this case, the light guide plate may be provided at a surface thereof facing the light emitting device module 100 with grooves to correspond to the respective light emitting device packages within the light emitting device module 100 as will be described hereinafter.

The first prism sheet 250 is prepared by laminating an elastic transparent polymeric material on a surface of a backing film. The polymeric material may include a prism layer in which a plurality of three-dimensional structures is repeatedly arranged. The plurality of structures may define a stripped pattern having repeated ridges and valleys as illustrated.

The second prism sheet 260 may be provided at one surface of a backing film thereof with ridges and valleys, the direction of the ridges and valleys formed on the second prism sheet 260 may be perpendicular to the direction of the ridges and valleys formed on the first prism sheet 250. This allows the first and second prism sheets 250 and 260 to uniformly disperse light transmitted from the light emitting device module and the reflector toward the entire panel 270.

Although not illustrated, a protective sheet may be disposed on each prism sheet. Specifically, the protective sheet may include protective layers formed on both surfaces of the backing film, the protective layers containing light diffusion particles and binders. Also, the prism layer may be made of a polymeric material selected from the group consisting of polyurethane, styrene butadiene copolymer, polyarcylate, polymethacrylate, polymethylmethacrylate, polyethylene terephthalate elastomer, polyisoprene and polysilicon.

Additionally, although not illustrated, a diffuser sheet may be disposed between the light guide plate 240 and the first prism sheet 250. The diffuser sheet may be formed of polyester based and polycarbonate based materials and may function to maximize a light transmission angle via refraction and scattering of incident light from the light emitting device module 100. The diffuser sheet may include a backup layer containing a light diffuser, and a first layer and a second layer respectively formed on a light emission surface (facing the first prism sheet) and a light incidence surface (facing the reflector) thereof, the first and second layers containing no light diffuser.

The backup layer may contain 0.1~10 parts by weight of a siloxane-based light diffuser having an average particle diameter of 1~10 μm and 0.1~10 parts by weight of an acryl-based light diffuser having an average particle diameter of 1~10 μm, on the basis of 100 parts by weight of a resin mixture of a methacrylic acid-styrene copolymer and a methacrylic acid methyl-styrene copolymer.

The first layer and the second layer may contain 0.01~1 parts by weight of an ultraviolet absorbent and 0.001~10 parts by weight of an anti-static agent, on the basis of 100 parts by weight of methacrylic acid methyl-styrene copolymer resin.

In the diffuser sheet, the backup layer may have a thickness of 100~10000 μm, and the first or second layer may have a thickness of 10~1000 μm, respectively.

In the present embodiment, the diffuser sheet, the first prism sheet 250 and the second prism sheet 260 serve as optical sheets. The optical sheets may be combined in other ways. For example, the optical sheets may be a micro lens array, a combination of a diffuser sheet and a micro lens array, or a combination of a single prism sheet and a micro lens array.

The panel 270 may be a liquid crystal display panel. Instead of the liquid crystal display panel 270, other kinds of display devices requiring a light source may be provided.

The panel 270 is constructed in such a way that liquid crystals are interposed between both glass bodies and polarizers are disposed respectively on the glass bodies to realize light polarization. Here, the liquid crystals have intermediate characteristics between liquid and solid. The liquid crystals, which are organic molecules having fluidity similar to liquid, have a regular molecular arrangement. Thus, the liquid crystals serve to display an image as the molecular arrangement thereof varies by an external electric field.

The liquid crystal display panel used in the display apparatus is of an active matrix type and utilizes a transistor as a switch to adjust voltage applied to each pixel.

The color filter 280 is provided at a front surface of the panel 270 and serves to selectively transmit light from the panel 270 through Red, Green and Blue pixels, enabling display of an image.

Figure 8A:
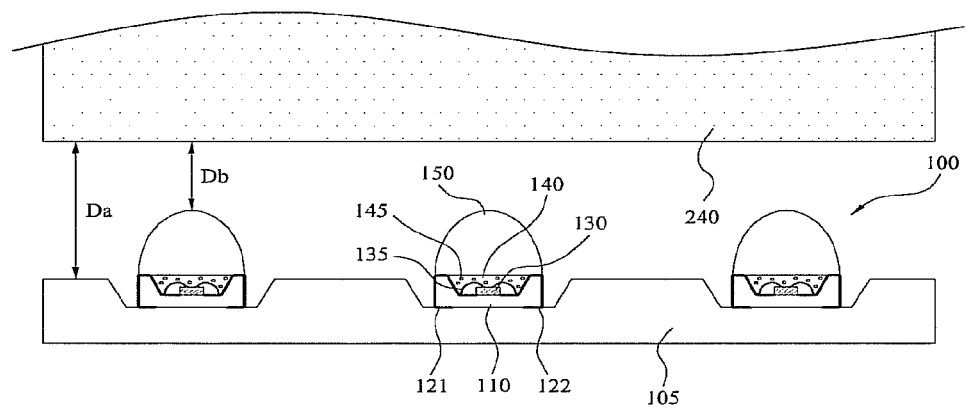
FIGS. 8A and 8B are views illustrating a light emitting device module and a light guide plate included in the display apparatus of FIG. 7.
Figure 8B:
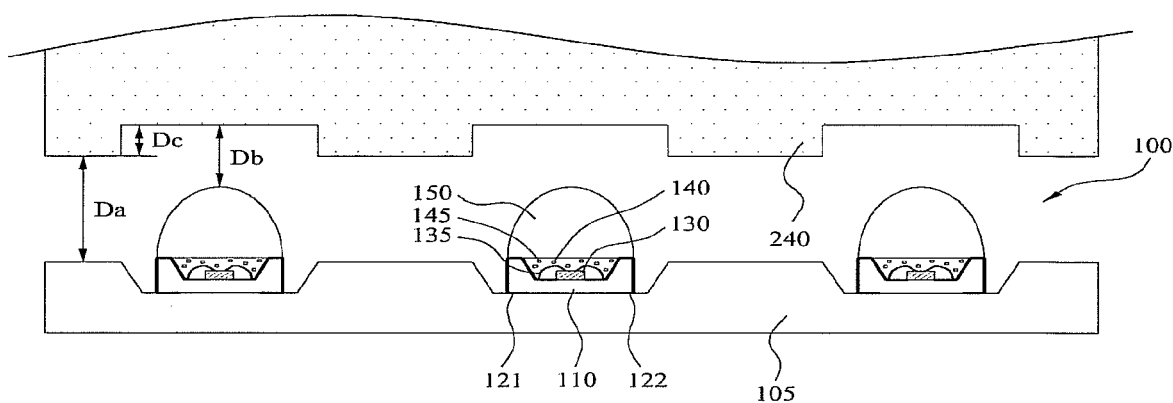

FIGS. 8A and 8B are views illustrating a light emitting device module and a light guide plate included in the display apparatus of FIG. 7.

As illustrated in FIG. 8A, in the light emitting device module, the cavities are formed in the circuit board 105 and the light emitting device package is inserted into each cavity, which may reduce a distance from the circuit board 105 to the light guide plate 240.

Specifically, it is necessary for the light guide plate 240 to be spaced apart from the light emitting device module 100 in consideration of thermal expansion and thus, the light guide plate 240 must be spaced apart from the light diffuser 150, such as the lens, of the light emitting device module 100 by a distance of about 2 mm. In this case, since the height of each light emitting device package is in a range from 1.6 mm to 2.0 mm and the distance $D_b$ between the light guide plate 240 and the light diffuser 150 is 2 mm, a distance from the surface of the circuit board 105 to the light guide plate 240 may be in a range from 3.1 mm to 3.7 mm in consideration of the fact that the depth of the cavity is in a range from 0.3 mm to 0.7 mm. That is, a space for installation of the light emitting device module 100 may be reduced in direct proportion to the depth of the cavity in the circuit board 105.

In an embodiment illustrated in FIG. 8B, the light guide plate 240 is provided at a surface thereof facing the light emitting device module 100 with grooves to correspond to the respective light emitting device packages of the light emitting device module 100.

Similarly, in the present embodiment, the distance between the light guide plate 240 and the light diffuser 150 must be kept at about 2.0 mm. In this case, as will be appreciated, as the light guide plate 240 is provided with the grooves to correspond to the respective light emitting device packages, a distance $D_a$ between the surface of the light guide plate 240 and the surface of the circuit board 105 is reduced by the depth $D_c$ of the grooves as compared to the embodiment illustrated in FIG. 8A.

Although the greater the depth $D_c$ of the grooves, the smaller the space between the light emitting device module 100 and the light guide plate 240, it is desirable that the depth $D_c$ of the grooves is not greater than the height from the surface of the circuit board 105 to the highest point of the light diffuser 150. Thus, the depth $D_c$ of the grooves may be in a range from 1.1 mm to 1.7 mm.

The display apparatus (i.e. a backlight unit) according to the embodiment is capable of reducing a space between the light emitting device module and the light guide plate. With efficient arrangement of the light guide plate and the light emitting device module, enhanced efficiency of light incident on the light guide plate may be accomplished.

As is apparent from the above description, a light emitting device module and a display apparatus according to the embodiments provide efficient arrangement of constituent elements thereof.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device module comprising:
a circuit board having a first recess, the first recess includes a bottom surface and an inclined surface;
a reflective layer formed on the bottom surface and the inclined surface; and
a light emitting device package disposed in the first recess and including a package body and a light emitting diode disposed on the package body, wherein the light emitting diode being electrically connected to a first lead frame in the light emitting device package, wherein the package body includes a second recess and the light emitting diode being disposed in the second recess, and
wherein a portion of the reflective layer is disposed between the bottom surface of the first recess and the package body, one side of the portion of the reflective layer contacts with the bottom surface of the first recess, and another side of the portion of the reflective layer contacts with a lower surface of the package body.

2. The light emitting device module according to claim 1, wherein at least a portion of the package body of the light emitting device package is inserted into the first recess.

3. The light emitting device module according to claim 1, wherein at least a portion of the light emitting diode is inserted into the second recess.

4. The light emitting device module according to claim 1, further comprising a light diffuser disposed on the top of the package body, wherein a height from a bottom surface of the first recess to a highest point of the light diffuser is in a range from 1.6 mm to 2.0 mm.

5. The light emitting device module according to claim 1, wherein a depth of the first recess is in a range from 0.3 mm to 0.7 mm.

6. The light emitting device module according to claim 1, wherein the the circuit board is electrically connected to the first lead frame and a second lead frame at the bottom surface of the first recess.

7. The light emitting device module according to claim 6, wherein the circuit board has at least two of the first recesses, and both inclined surfaces of neighboring first recesses define a partition that divides both light emitting device packages disposed respectively in the neighboring first recesses from each other.

8. The light emitting device module according to claim 1, wherein the reflective layer is disposed on a partition between neighboring first recesses.

9. The light emitting device module according to claim 1, wherein the circuit board has at least two of the first recesses and wherein the reflective layer is disposed on a sidewall of a partition between neighboring first recesses.

10. The light emitting device module according to claim 4, wherein a height of the package body is in a range from 0.3 mm to 0.7 mm, and a height of the light diffuser is in a range from 1.3 mm to 1.5 mm.

11. The light emitting device module according to claim 1, further comprising a molding part that covers the light emitting diode.

12. The light emitting device module according to claim 11, wherein the molding part contains a fluorescent substance.

13. A light emitting device module comprising:
a circuit board including a first layer and a second layer, the second layer having a first recess, the first recess includes a bottom surface and an inclined surface;
a reflective layer disposed on the bottom surface and the inclined surfaces;
at least one light emitting device package disposed in the first recess; and
a light diffuser disposed on the top surface of the package body, wherein each light emitting device package includes a package body and a light emitting diode disposed on the package body, wherein the light emitting diode being electrically connected to a first lead frame and a second lead frame, and the package body includes a second recess and the light emitting diode is disposed in the second recess,
wherein a portion of the reflective layer is disposed between the bottom surface of the first recess and the light emitting device package, one side of the portion of the reflective layer contacts with the bottom surface of the first recess, and another side of the portion of the reflective layer contacts with a lower surface of the package body.

14. The light emitting device module according to claim 13, wherein the reflective layer is disposed on a bottom surface of the first recess and the reflective layer comes into contact with a lower surface of the package body.

15. The light emitting device module according to claim 13, wherein the circuit board has at least two of the first recesses, and the reflective layer is disposed on a partition between package bodies disposed in neighboring first recess.

16. A backlight unit comprising:
a light emitting device module;
a light guide plate to diffuse light introduced from the light emitting device module;
a bottom cover to accommodate the light emitting device module and the light guide plate, wherein the light emitting device module includes: a circuit board having a first recess, the first recess includes a bottom surface and an inclined surface;
a reflective layer disposed on the bottom surface and the inclined surfaces; and
a light emitting device package disposed in the first recess and including a package body and a light emitting diode disposed on the package body, wherein the light emitting diode being electrically connected to a first lead frame and a second lead frame, and the package body has a second recess and the light emitting diode is disposed in the second recess,
wherein a portion of the reflective layer is disposed between the bottom surface of the first recess and the package body, one side of the portion of the reflective layer contacts with the bottom surface of the first recess, and another side of the portion of the reflective layer contacts with a lower surface of the package body.

17. The backlight unit according to claim 16, wherein the light emitting device module further includes a lens to change a path of light emitted from the light emitting diode, and the light guide plate is provided at a surface thereof facing the light emitting device module with a groove corresponding to the lens of the light emitting device module.

18. The light emitting device module according to claim 1, wherein the first lead frame and the second lead frame are disposed on the lower surface of the package body, a side surface of the package body and a bottom surface of the second recess.

19. The light emitting device module according to claim 13, wherein the circuit board is electrically connected to the first lead frame and the second lead frame at the bottom surface of the first recess.

20. The backlight unit according to claim 16, wherein the first lead frame and the second lead frame are disposed on the lower surface of the package body, a side surface of the package body and a bottom surface of the second recess.

* * * * *